(12) United States Patent
Watanabe et al.

(10) Patent No.: US 8,610,449 B2
(45) Date of Patent: Dec. 17, 2013

(54) WAFER UNIT FOR TESTING AND TEST SYSTEM

(75) Inventors: Daisuke Watanabe, Saitama (JP); Toshiyuki Okayasu, Saitama (JP)

(73) Assignee: Advantest Corporation, Tokyo (JP)

(*) Notice: Subject to any disclaimer, the term of this patent is extended or adjusted under 35 U.S.C. 154(b) by 224 days.

(21) Appl. No.: 12/954,565

(22) Filed: Nov. 24, 2010

(65) Prior Publication Data
US 2011/0128027 A1 Jun. 2, 2011

Related U.S. Application Data

(63) Continuation of application No. PCT/JP2008/060173, filed on Jun. 2, 2008.

(51) Int. Cl.
G01R 31/26 (2006.01)

(52) U.S. Cl.
USPC .................................................. 324/762.01

(58) Field of Classification Search
USPC ............... 324/762.01–762.1, 754.01–754.3, 324/755.01–755.1; 257/48
See application file for complete search history.

(56) References Cited

U.S. PATENT DOCUMENTS

| | | | |
|---|---|---|---|
| 5,929,650 A * | 7/1999 | Pappert et al. | 324/750.3 |
| 7,049,839 B1 * | 5/2006 | Hsiao et al. | 324/750.3 |
| 2002/0039802 A1 | 4/2002 | Ban et al. | |
| 2002/0087924 A1 | 7/2002 | Panis et al. | |
| 2005/0243906 A1 | 11/2005 | Awaji et al. | |
| 2006/0123304 A1 | 6/2006 | Panis et al. | |

FOREIGN PATENT DOCUMENTS

| | | |
|---|---|---|
| JP | 6-289099 A | 10/1994 |
| JP | 2002-110751 A | 4/2002 |
| JP | 2004-525546 A | 8/2004 |
| JP | 2005-292004 A | 10/2005 |
| TW | 200706892 | 2/2007 |
| TW | 200728724 | 8/2007 |

OTHER PUBLICATIONS

International Search Report (ISR) issued in PCT/JP2008/060173 (parent application) mailed in Sep. 2008 for Examiner consideration, citing U.S. Patent Application Publication No. 4 and Foreign Patent document Nos. 3-4.
Written Opinion (PCT/ISA/237) issued in PCT/JP2008/060173 (parent application) mailed in Sep. 2008.
TW Office Action/ Search Report and English Translation Dated Sep. 24, 2012; Application No. 098118196.

* cited by examiner

Primary Examiner — Tung X Nguyen

(57) ABSTRACT

Provided is a test wafer unit that tests a plurality of circuits under test formed on a wafer under test. The test wafer unit comprises a test wafer that is formed of a semiconductor material and exchanges signals with each of the circuits under test, and a plurality of loop-back sections that are provided in the test wafer to correspond to the plurality of circuits under test and that each supply the corresponding circuit under test with a loop-back signal corresponding to a signal received from the corresponding circuit under test.

20 Claims, 9 Drawing Sheets

WAFER UNIT FOR TESTING AND TEST SYSTEM

BACKGROUND

1. Technical Field

The present invention relates to a test wafer unit and a test system. In particular, the present invention relates to a test wafer unit and a test system for testing a plurality of circuits under test formed on a wafer under test.

2. Related Art

One test for a circuit under test having a semiconductor circuit or the like involves judging whether a transmission circuit and a reception circuit of a circuit under test are operating correctly by looping a signal output by the transmission circuit back to the reception circuit. For example, it is possible to judge whether the transmission circuit and the reception circuit are operating properly based on reception results of a signal received by the reception circuit when the transmission circuit outputs a predetermined signal.

A test apparatus for testing a circuit under test includes a main body and a performance board. The performance board is disposed near the device under test and transmits signals between the main body and the device under test. The main body includes modules for testing the circuit under test, and tests the circuit under test via the performance board.

When performing a loop back test on the circuit under test, the test apparatus feeds back the output signal of the circuit under test within the main body, thereby looping the signal back to the circuit under test. For example, see Japanese Patent Application Publication No. 2005-292004 and Japanese Translation of PCT International Application No. 2004-525546.

When looping back the signal in the main body of the test apparatus, however, the transmission path of the loop-back signal is lengthened, thereby causing degradation of the loop-back signal. Therefore, it is difficult to accurately perform a loop-back test. Furthermore, since the resistance and capacitance of the transmission path are relatively large, it is necessary to provide drivers at the signal output ends of the circuit under test and the main body to drive the transmission path. In addition, the locations at which a signal can be taken from the circuit under test are limited to the signal output ends where a driver is provided.

One technique involves shortening the transmission path by feeding back the signal in the performance board. However, when the plurality of circuits under test on the wafer under test are tested en bloc, it is necessary to provide a loop-back path corresponding to each circuit under test on the performance board.

Another technique involves adding prescribed noise to the signal output by the circuit under test and looping back the resulting signal. In this case, a noise generation circuit must be provided in each loop-back path of the performance board. A print substrate is usually used as the performance board, and so it is not easy to dispose on the performance board noise generation circuits corresponding to the circuits under test formed on the wafer under test.

SUMMARY

Therefore, it is an object of an aspect of the innovations herein to provide a test wafer unit and a test system, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a test wafer unit that tests a plurality of circuits under test formed on a wafer under test. The test wafer unit comprises a test wafer that is formed of a semiconductor material and exchanges signals with each of the circuits under test, and a plurality of loop-back sections that are provided in the test wafer to correspond to the plurality of circuits under test and that each supply the corresponding circuit under test with a loop-back signal corresponding to a signal received from the corresponding circuit under test.

According to a first aspect related to the innovations herein, provided is a test system that tests a plurality of circuits under test formed on a wafer under test. The test system comprises a test wafer unit that exchanges signals with the circuits under test, and a control apparatus that controls the test wafer unit. The test wafer unit includes a test wafer that is formed of a semiconductor material and exchanges signals with each of the circuits under test, and a plurality of loop-back sections that are provided in the test wafer to correspond to the plurality of circuits under test and that each supply the corresponding circuit under test with a loop-back signal corresponding to a signal received from the corresponding circuit under test.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
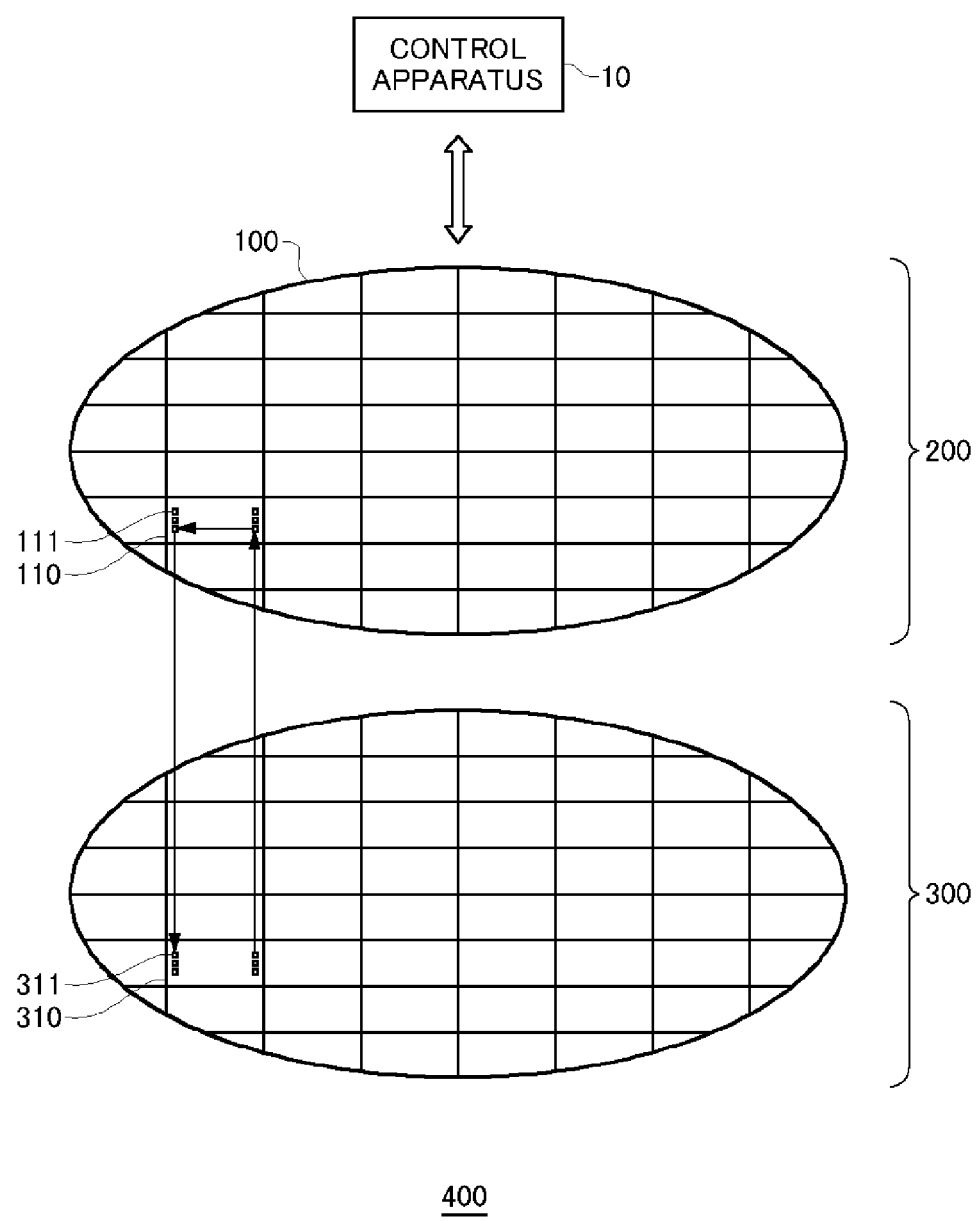
FIG. 1 shows an exemplary test system 400.

FIG. 1 shows an exemplary test system 400. The test system 400 tests a plurality of circuits under test 310 formed on a wafer under test 300. The wafer under test 300 may be a silicon wafer, and the circuits under test 310 may be formed on the wafer under test 300 using a semiconductor process such as lithography.

The test system 400 of the present embodiment tests the plurality of circuits under test 310 in parallel. The test system 400 includes a test wafer unit 200 and a control apparatus 10.

The test wafer unit 200 includes a test wafer 100. The test wafer 100 may test the circuits under test 310 of the wafer under test 300 en bloc.

The test wafer 100 may include a plurality of test circuits 110 that correspond one-to-one with the circuits under test 310. Each test circuit 110 tests the corresponding circuit under test 310. For example, each test circuit 110 may test the corresponding circuit under test 310 by detecting a response signal output by the circuit under test 310 when a prescribed signal is supplied thereto. Each test circuit 110 may include a plurality of test terminals 111 that correspond one-to-one with a plurality of external terminals 311 provided on the circuit under test 310. If the circuits under test 310 are packaged as semiconductor chips, the external terminals 311 may be electrically connected to terminals that protrude to the outside.

In the present embodiment, each test circuit 110 performs a loop-back test on the corresponding circuit under test 310. For example, each test circuit 110 may supply the corresponding circuit under test 310 with a loop-back signal corresponding to a signal received from the circuit under test 310.

Each test terminal 111 exchanges signals with the corresponding external terminal 311. For example, each test terminal 111 may exchange electrical signals with the corresponding external terminal 311 by being electrically connected thereto. Each test terminal 111 may exchange signals with the corresponding external terminal 311 via non-contact coupling such as electrostatic coupling or inductive coupling. Each test terminal 111 may exchange signals with the corresponding external terminal 311 via an optical transmission path. The following describes an example in which each test terminal 111 is electrically connected to the corresponding external terminal 311.

Each test terminal 111 may contact the corresponding external terminal 311 to be electrically connected thereto. For example, the test terminals 111 and the external terminals 311 may be brought into direct contact with each other by affixing the test wafer 100 to the wafer under test 300.

Each test terminal 111 may be electrically connected to the corresponding external terminal 311 via a semiconductor. For example, the test terminals 111 and the external terminals 311 may be electrically connected to each other via a probe substrate by affixing the test wafer 100 to the wafer under test 300 via a probe substrate. In this case, a plurality of front surface terminals electrically connected to the test terminals 111 are formed on the front surface of the probe substrate and a plurality of back surface terminals electrically connected to the external terminals 311 are formed on the back surface of the probe substrate. Via holes may be formed passing through the probe substrate to electrically connect the front surface terminals and back surface terminals thereof. With this configuration, the test terminals 111 and external terminals 311 can be electrically connected. In the probe card, the intervals between pads on the front surface may be different from the intervals between pads on the back surface.

An anisotropic conductive sheet may be provided between the test wafer 100 and the wafer under test 300. The anisotropic conductive sheet electrically connects the test terminals 111 to the external terminals 311 by being pressed therebetween when the test wafer 100 is affixed to the wafer under test 300.

The control apparatus 10 controls the test wafer 100. The control apparatus 10 may control the plurality of test circuits 110. For example, the control apparatus 10 may supply each test circuit 110 with a clock signal or an operation initiation signal that causes the test circuits 110 to operate in synchronization.

The test wafer 100 may have a shape corresponding to that of the wafer under test 300. Here, a "corresponding shape" refers to identical shapes or shapes by which one wafer is a portion of the other.

The test wafer 100 may have the same shape as the wafer under test 300. More specifically, the test wafer 100 may be disc-shaped and have a diameter substantially equal to that of the wafer under test 300. The test wafer 100 may have a shape that covers a portion of the wafer under test 300 when the test wafer 100 and the wafer under test 300 are stacked. When the wafer under test 300 is disc-shaped, the test wafer 100 may have a shape that occupies a portion of this disc, such as a half-circle shape.

The test wafer 100 may be made of the same semiconductor material as the wafer under test 300. In this case, the test circuits 110 may be formed on the test wafer 100 using a semiconductor process such as lithography. The test wafer 100 may be a print substrate. In this case, circuit chips including the test circuits 110 may be mounted on the print substrate.

By providing the test circuits 110 for testing the circuits under test 310 on the test wafer 100 arranged near the wafer under test 300 in this way, the transmission paths between the circuits under test 310 and the test circuits 110 can be shortened. In other words, since the test wafer 100 is directly or indirectly affixed to the wafer under test 300, the transmission paths between the test circuits 110 and the circuits under test 310 need not include cables or the like. Therefore, the degradation of the loop-back signals supplied to the circuits under test 310 can be decreased to accurately perform loop-back testing of the circuits under test 310.

Figure 2:
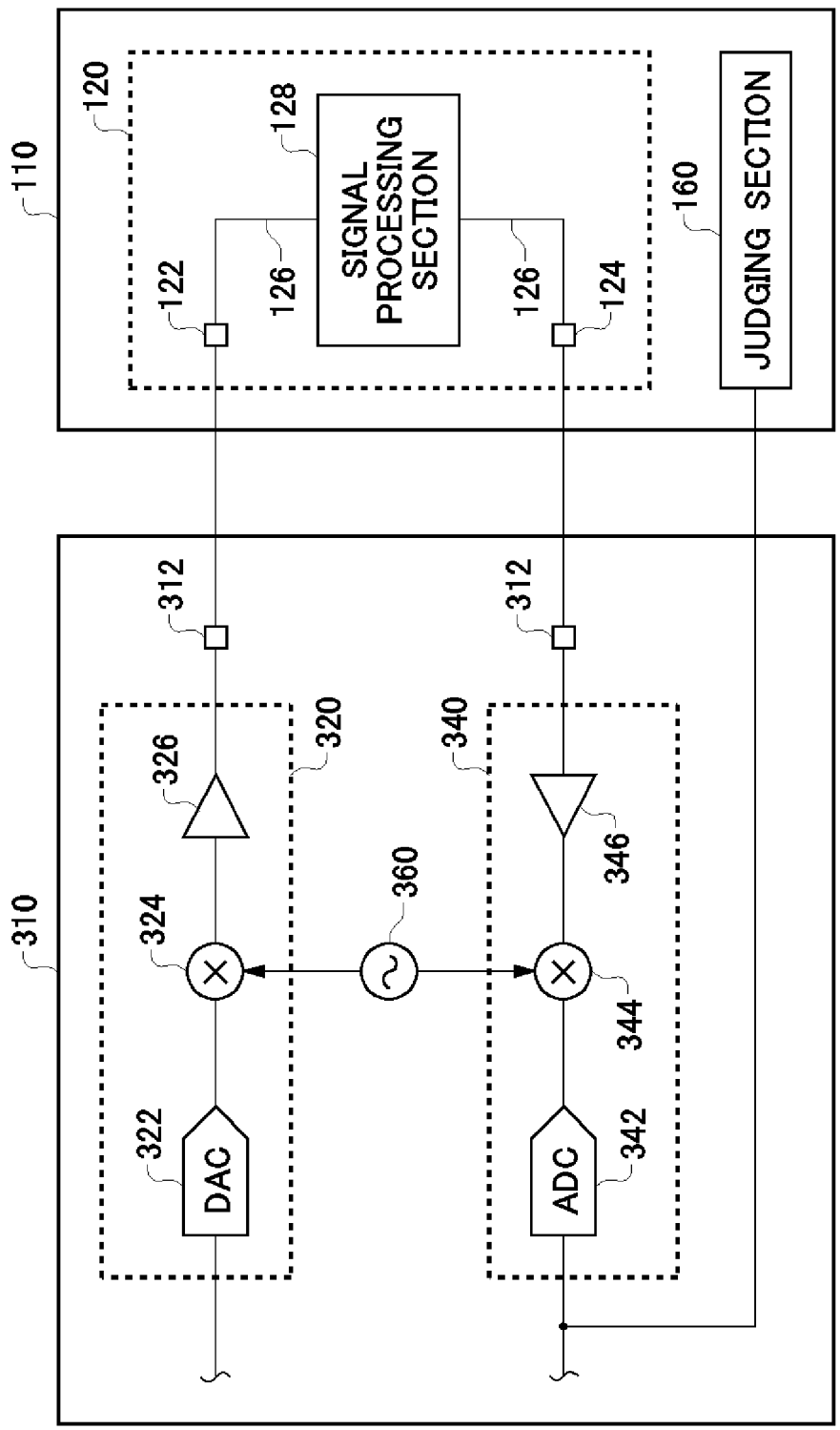
FIG. 2 shows an exemplary configuration of a circuit under test 310 and a test circuit 110.

FIG. 2 shows an exemplary configuration of a circuit under test 310 and a test circuit 110. Each circuit under test 310 may have the same configuration. Each test circuit 110 may also have the same configuration.

The circuit under test 310 of the present embodiment includes a local oscillator 360, a transmission-side circuit 320, a reception-side circuit 340, and a plurality of actual operation terminals 312. The actual operation terminals 312 are examples of the external terminals 311, and are used when the circuits under test 310 are mounted. For example, when the circuit under test 310 is mounted on a communication device, the actual operation terminals 312 may be electrically connected to terminals of other circuits in the communication device or to terminals of other circuits outside the communication device.

The transmission-side circuit 320 outputs a transmission signal to be transmitted from the communication device. The transmission-side circuit 320 of the present embodiment includes a DA converter 322, a mixer 324, and a driver 326. The DA converter 322 converts a digital signal supplied thereto into an analog signal. For example, the DA converter 322 may receive a digital signal indicating a logic pattern to be included in the transmission signal.

The mixer 324 multiplies the analog signal output from the DA converter 322 by a local signal output from the local oscillator 360. In other words, the mixer 324 shifts the frequency of the analog signal according to the frequency of the local signal. The driver 326 supplies an actual operation terminal 312 with the signal output by the mixer 324. The driver 326 may be a power amplifier that can output power in a prescribed range. The transmission-side circuit 320 may include a filter downstream from the mixer 324. With this configuration, the transmission-side circuit 320 generates an analog signal corresponding to the digital signal supplied thereto.

The reception-side circuit 340 of the present invention includes an AD converter 342, a mixer 344, and a low-noise amplifier 346. The low-noise amplifier 346 receives a signal from an external circuit via an actual operation terminal 312. The low-noise amplifier 346 outputs a signal corresponding to the received signal.

The mixer 344 outputs a signal obtained as the product of the signal output by the low-noise amplifier 346 and the signal output by the local oscillator 360. The AD converter 342 converts the analog signal received from the local oscillator 360 into a digital signal. The reception-side circuit 340 may include a filter downstream from the mixer 344. With this configuration, the reception-side circuit 340 generates a digital signal corresponding to the received analog signal.

The test circuit 110 includes a loop-back section 120 and a judging section 160. The loop-back section 120 of the present embodiment receives an output signal from the transmission-side circuit 320 via an actual operation terminal 312. The loop-back section 120 loops the signal generated by the transmission-side circuit 320 back to the reception-side circuit 340 by supplying the reception-side circuit 340, via an actual operation terminal 312, with a loop-back signal corresponding to the received output signal. The loop-back section 120 of the present embodiment includes a loop input terminal 122, a loop output terminal 124, and wiring 126. The loop input terminal 122 and the loop output terminal 124 are examples of test terminals 111.

The loop input terminal 122 is electrically connected to the transmission-side circuit 320 via an actual operation terminal 312. The loop output terminal 124 is electrically connected to the reception-side circuit 340 via an actual operation terminal 312. The wiring 126 is provided between the loop input terminal 122 and the loop output terminal 124, and transmits signals from the loop input terminal 122 to the loop output terminal 124. With this configuration, the reception-side circuit 340 can be supplied with a loop-back signal corresponding to the output signal of the transmission-side circuit 320.

The judging section 160 judges pass/fail of the circuit under test 310 based on the signal generated by the reception-side circuit 340 according to the loop-back signal. For example, the judging section 160 may judge pass/fail of the circuit under test 310 based on whether electrical characteristics such as edge timing or a logic pattern of the signal generated by the reception-side circuit 340 match a prescribed expected value. The judging section 160 may instead be included in the circuit under test 310. In this case, the test circuit 110 may receive a judgment result from the judging section 160 in the circuit under test 310. The judging section 160 may transmit the judgment results to the control apparatus 10.

As shown in FIG. 2, the loop-back section 120 may further include a signal processing section 128. The signal processing section 128 may perform a prescribed process on the loop-back signal transmitted on the wiring 126. For example, the signal processing section 128 may apply noise, such as predetermined amplitude noise or phase noise, to the loop-back signal. The signal processing section 128 may pass the loop-back signal through an emulator circuit that simulates a predetermined transmission path.

With this configuration, a loop-back test can be preformed for a variety of simulated transmission paths. Furthermore, by using a semiconductor wafer as the test wafer 100, a large number of signal processing sections 128 corresponding to a large number of circuits under test 310 can be easily formed using a semiconductor process such as lithography.

Figure 3:
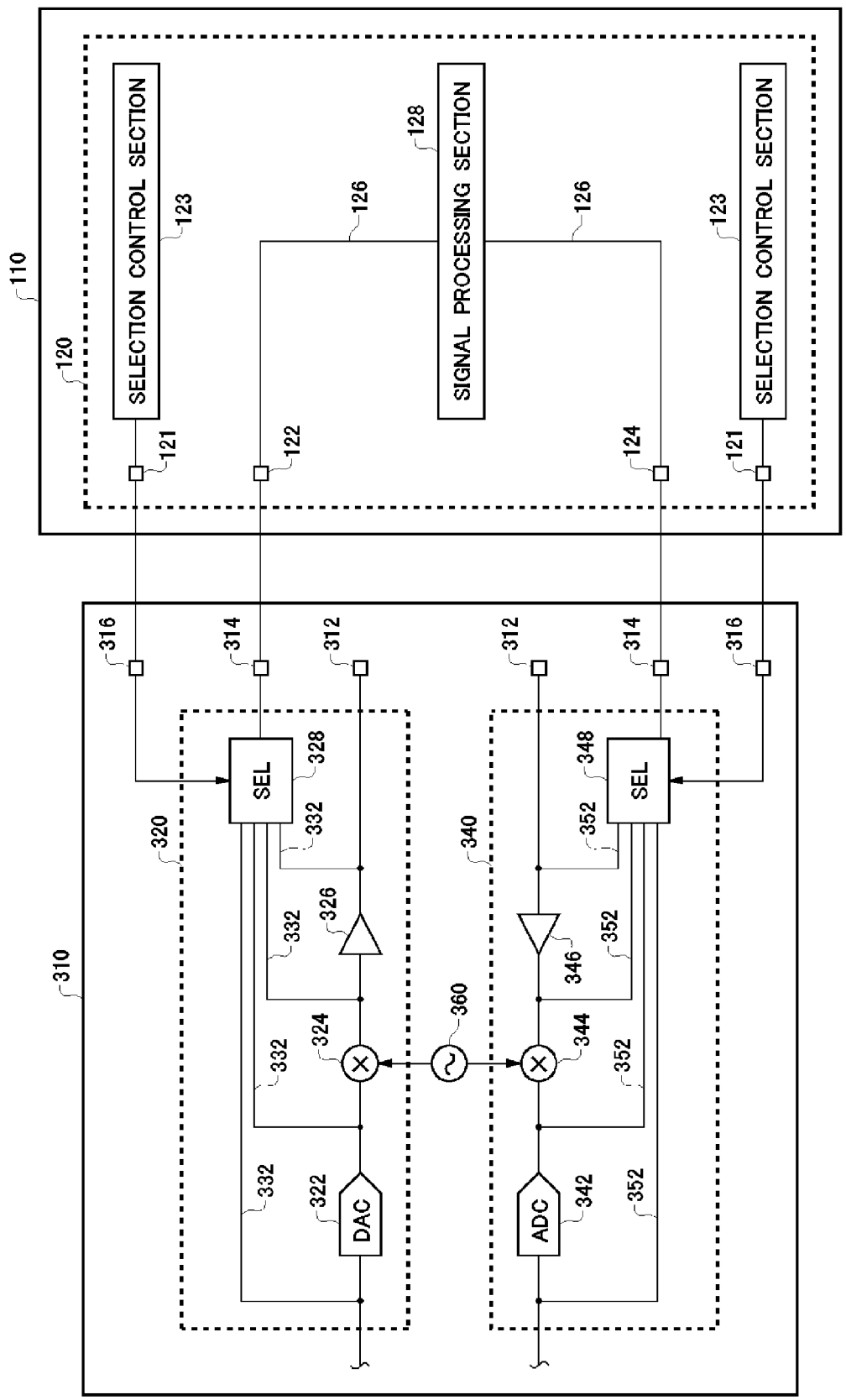
FIG. 3 shows another exemplary configuration of a circuit under test 310 and a test circuit 110.

FIG. 3 shows another exemplary configuration of a circuit under test 310 and a test circuit 110. The circuit under test 310 of the present embodiment further includes a selecting section 328, a plurality of measurement lines 332, a measurement terminal 314, and a control terminal 316 in addition to the configuration of the circuit under test 310 described in relation to FIG. 2. Other configurational elements of this circuit under test 310 may be the same as those of the circuit under test 310 described in relation to FIG. 2. The measurement terminal 314 and the control terminal 316 are examples of external terminals 311. The test circuit 110 of the present embodiment acquires an internal signal transmitted on an internal node of the circuit under test 310, and supplies an internal node of the circuit under test 310 with a loop-back signal corresponding to the internal signal.

The measurement lines 332 are provided to correspond to the internal nodes in the circuit under test 310, and each measurement line 332 is electrically connected to a corresponding internal node. For example, in the transmission-side circuit 320, first ends of the measurement lines 332 are respectively electrically connected to the input end of the DA converter 322, the output end of the DA converter 322, the output end of the mixer 324, and the output end of the driver 326.

The selecting section 328 selects which of the measurement lines 332 is electrically connected to a measurement terminal 314. The selecting section 328 may select the measurement line 332 according to the control signal supplied from the test circuit 110. The circuit under test 310 may receive the control signal from the test circuit 110 via the control terminal 316.

As described above, the test circuit 110 is provided near the circuit under test 310, and therefore the internal signal transmitted on the internal node can be acquired without passing through the driver or the like, by connecting a measurement line 332 to a measurement point within the transmission-side circuit 320. By providing the selecting section 328, a number of measurement terminals 314 less than the number of internal nodes can be used to acquire signals in the internal nodes. Therefore, in the circuit under test 310, the area occupied by the measurement terminals 314 can be decreased.

The measurement terminals 314 and the control terminals 316 may be electrically connected to an external test circuit 110 when the circuit under test 310 is tested. Furthermore, when the circuit under test 310 is mounted in a communication device, the measurement terminals 314 and the control terminals 316 are not electrically connected to other circuits in the communication device.

In the reception-side circuit 340 as well, the measurement lines 352 may be respectively connected to the internal nodes of the reception-side circuit 340. The measurement lines 352 are provided to correspond to the internal nodes of the reception-side circuit 340, and each measurement line 352 is electrically connected to a corresponding internal node. For example, in the reception-side circuit 340, first ends of the measurement lines 352 may be respectively electrically connected to the input end of the AD converter 342, the output end of the AD converter 342, the output end of the mixer 344, and the output end of the low-noise amplifier 346.

The selecting section 348 selects which of the measurement lines 352 is electrically connected to a measurement terminal 314. The selecting section 348 may select the measurement line 352 according to the control signal supplied from the test circuit 110. With this configuration, the loop-back signal can be supplied to a prescribed internal node of the reception-side circuit 340.

The selecting section 328 and the selecting section 348 may select corresponding internal nodes that form a circuit pair in the circuit under test 310. Here, the corresponding internal nodes may refer to measurement points at which the characteristics of the transmission signal are the same. The characteristics of the transmission signal may refer to the level, frequency, analog/digital type, or the like of the signal.

For example, when the selecting section 328 selects the internal node at the output end of the DA converter 322, the signal transmitted on this node is a baseband analog signal. In this case, the selecting section 348 may select the internal node at the input end of the AD converter 342 in the reception-side circuit 340, where a baseband analog signal is transmitted. In order to select the internal nodes in this way, the test circuit 110 may supply the selecting section 328 and the selecting section 348 with control signals. With this control, a variety of loop-back tests can be performed for the circuit under test 310. Furthermore, by providing a plurality of measurement lines, external terminals, and selecting sections for each circuit under test 310, the test circuit 110 can perform a variety of loop-back tests for each circuit under test 310.

The loop-back section 120 of the present embodiment receives the internal signal transmitted on the internal nodes of the transmission-side circuit 320, via a measurement terminal 314 that functions as a measurement output terminal. The loop-back section 120 supplies the internal nodes of the reception-side circuit 340 with a loop-back signal corresponding to the received internal signal, via a measurement terminal 314 that functions as a measurement input terminal. The loop-back section 120 further includes control output terminals 121 and selection control sections 123 in addition to the configuration of the loop-back section 120 described in relation to FIG. 2. Other configurational elements of this test circuit 110 may be the same as those of the test circuit 110 described in relation to FIG. 2.

The selection control sections 123 control the selecting section 328 and the selecting section 348 to select an internal node of the transmission-side circuit 320 at which the internal signal is to be acquired and an internal node of the reception-side circuit 340 to which the loop-back signal is to be supplied. The selection control sections 123 may supply control signals to the selecting section 328 and the selecting section 348 via the control output terminals 121. The control output terminals 121 are examples of the test terminals 111.

As described above, the selection control sections 123 may select internal nodes that form a pair in the transmission-side circuit 320 and the reception-side circuit 340. With this configuration, the test circuit 110 can perform a variety of loop-back tests on the circuit under test 310.

In FIG. 3, the loop-back section 120 exchanges signals with the transmission-side circuit 320 and the reception-side circuit 340 via the measurement terminals 314. As another example, the loop-back section 120 may acquire the internal signal from the transmission-side circuit 320 via a measurement terminal 314 and supply the reception-side circuit 340 with a loop-back signal corresponding to the internal signal via an actual operation terminal 312. As yet another example, the loop-back section 120 may acquire the output signal from the transmission-side circuit 320 via an actual operation terminal 312 and supply an internal node of the reception-side circuit 340 with a loop-back signal corresponding to the output signal via a measurement terminal 314.

Figure 4:
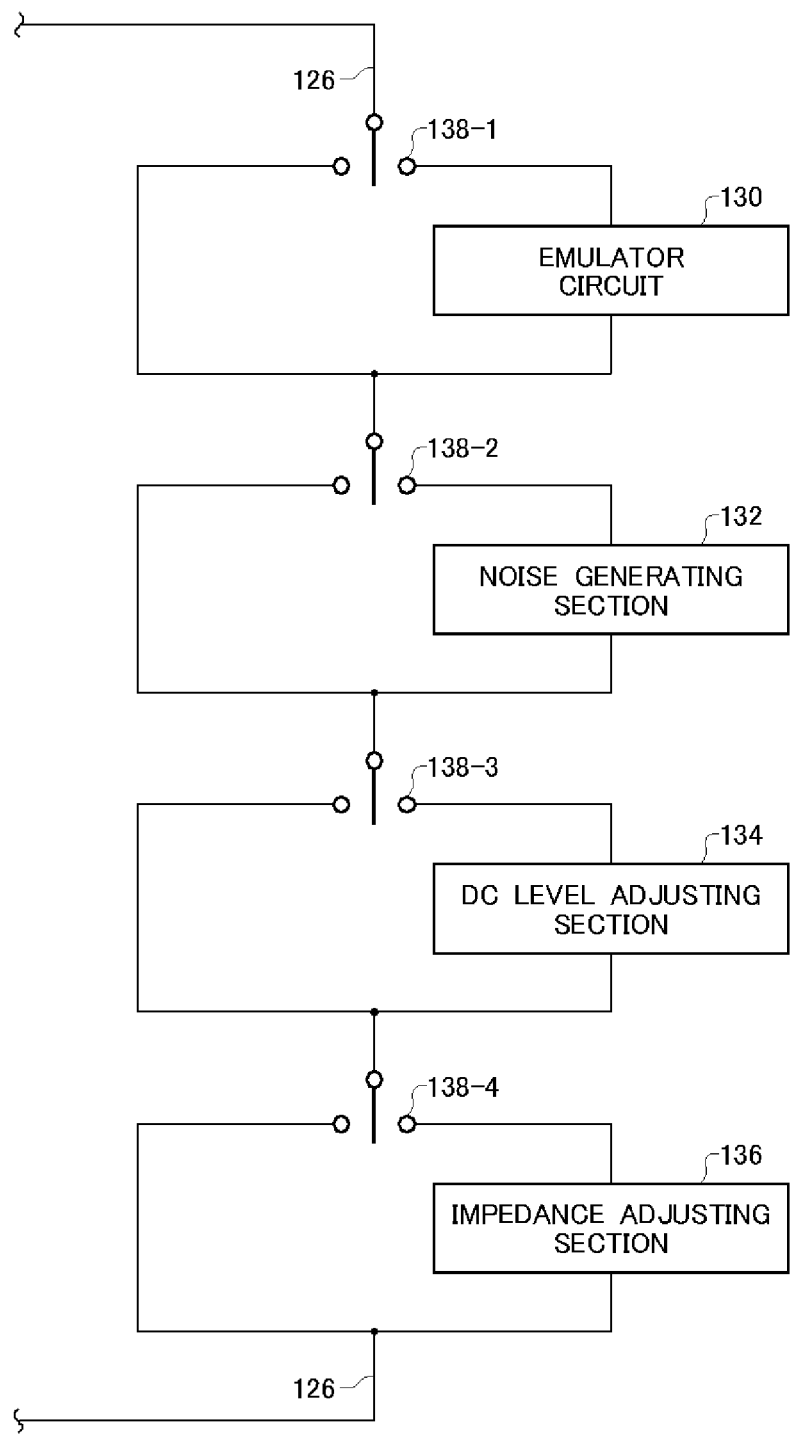
FIG. 4 shows an exemplary configuration of the signal processing section 128.

FIG. 4 shows an exemplary configuration of the signal processing section 128. In FIG. 4, the configuration of the signal processing section 128 is shown to include an emulator circuit 130, a noise generating section 132, a DC level adjusting section 134, and an impedance adjusting section 136, but the signal processing section 128 may instead have a configuration including any one of these components. As shown in FIG. 4, the signal processing section 128 may generate the loop-back signal using the configurational elements selected by switches 138. The signal processing section 128 may be a circuit that includes two or more of the above components.

The emulator circuit 130 generates the loop-back signal by passing the signal received from the circuit under test 310, and simulates characteristics of a predetermined transmission path. For example, by using a delay circuit and a band pass filter, the emulator circuit 130 may have substantially the same transmission characteristics as a prescribed transmission path. The emulator circuit 130 may be a multi-path phasing circuit that is provided in parallel with a plurality of serially connected delay circuits and band pass filters and that passes the loop-back signal through each path. The emulator circuit 130 may have an attenuator that attenuates the amplitude of the loop-back signal.

The noise generating section 132 generates the loop-back signal by adding predetermined noise to the signal received from the circuit under test 310. For example, the noise generating section 132 may generate a loop-back signal having amplitude noise added thereto or a loop-back signal having phase noise added thereto. The noise generating section 132 may add noise to the signal using an amplitude modulator or a phase modulator.

The DC level adjusting section 134 generates the loop-back signal by adjusting the DC level of the signal received from the circuit under test 310. For example, the DC level adjusting section 134 may adjust the DC level of the loop-back signal based on the specifications of the reception-side circuit 340. The DC level adjusting section 134 may generate the loop-back signal by eliminating the DC component of the signal received from the transmission-side circuit 320.

The impedance adjusting section 136 matches the impedance between the transmission path on which the loop-back signal is transmitted and the circuit under test 310. For example, the impedance adjusting section 136 may be provided on the wiring 126 and have an impedance corresponding to the input/output impedance of the circuit under test 310. The impedance adjusting section 136 may have a variable impedance.

The switches 138 are provided to correspond to the emulator circuit 130, the noise generating section 132, the DC level adjusting section 134, and the impedance adjusting section 136. Each switch 138 switches whether the loop-back signal transmitted on the wiring 126 (i) passes through a circuit such as the emulator circuit to be supplied to the path that transmits this signal to the circuit at the next stage or (ii) bypasses this circuit to be supplied to the path that transmits this signal to the circuit at the next stage. With this configuration, a variety of loop-back tests can be performed on the circuit under test 310.

Figure 5:
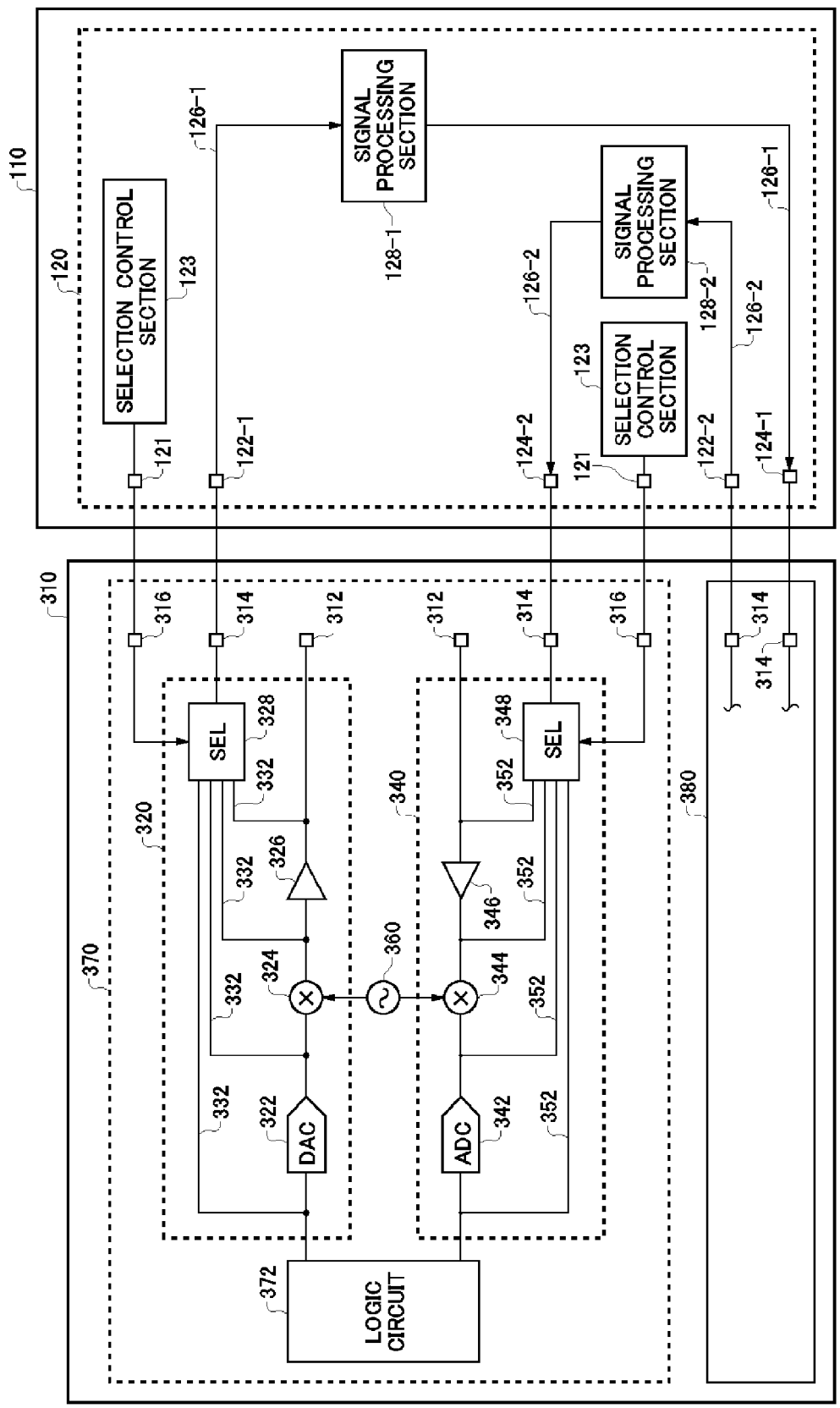
FIG. 5 shows another exemplary configuration of a circuit under test 310 and a test circuit 110.

FIG. 5 shows another exemplary configuration of a circuit under test 310 and a test circuit 110. The test circuit 110 of the present embodiment supplies a second operation circuit 380 in the circuit under test 310 with a signal received from a first operation circuit 370 in the circuit under test 310. The second operation circuit 380 receives a signal generated according to the above signal, and loops the generated signal back to the first operation circuit 370. In other words, the test circuit 110 of the present embodiment uses the second operation circuit 380 of the circuit under test 310 to generate a loop-back signal to the first operation circuit 370.

The circuit under test 310 of the present embodiment includes the first operation circuit 370 and the second operation circuit 380. The first operation circuit 370 and the second operation circuit 380 may have the same configuration as the circuits under test 310 described in FIG. 2 or FIG. 3.

The test circuit 110 of the present embodiment includes a first loop input terminal 122-1, first wiring 126-1, a first loop output terminal 124-1, a second loop input terminal 122-2, second wiring 126-2, and a second loop output terminal 124-2. The test circuit 110 of the present embodiment may further include control output terminals 121 and selection control sections 123, in the same manner as the test circuit 110 described in relation to FIG. 3.

The first loop input terminal 122-1 receives the signal generated by the first operation circuit 370. The first loop input terminal 122-1 of the present embodiment receives the internal signal of the first operation circuit 370. The first wiring 126-1 is provided between the first loop input terminal 122-1 and the first loop output terminal 124-1, and transmits the signal from the first loop input terminal 122-1 to the first loop output terminal 124-1. The first loop output terminal 124-1 supplies the second operation circuit 380 with the signal received from the first wiring 126-1. The first loop output terminal 124-1 of the present embodiment supplies this signal to an internal node of the second operation circuit 380.

The second loop input terminal 122-2 receives the signal generated by the second operation circuit 380. The second loop input terminal 122-2 of the present embodiment acquires the signal from an internal node of the second operation circuit 380. For example, the second loop input terminal 122-2 may acquire the signal output by a filter or the like within the second operation circuit 380.

The second wiring 126-2 is provided between the second loop input terminal 122-2 and the second loop output terminal 124-2, and transmits the signal from the second loop input terminal 122-2 to the second loop output terminal 124-2. The second loop output terminal 124-2 supplies the first operation circuit 370 with the loop-back signal received from the second wiring 126-2. The second loop output terminal 124-2 of the present embodiment supplies the loop-back signal to an internal node of the first operation circuit 370.

With this configuration, internal circuits of the circuit under test 310 can be used to generate the loop-back signal. Therefore, the circuit size of the loop-back section 120 can be decreased. Furthermore, as shown in FIG. 5, the loop-back section 120 may further include a first signal processing section 128-1 and a second signal processing section 128-2.

The first signal processing section 128-1 and the second signal processing section 128-2 may be the same as the signal processing section 128 described in relation to FIGS. 2 to 4. In the present embodiment, internal circuits of the circuit under test 310 can be used to apply noise or the like to the loop-back signal, and therefore the first signal processing section 128-1 and the second signal processing section 128-2 may include the DC level adjusting section 134 and the impedance adjusting section 136. With this configuration, a test circuit 110 with a relatively small circuit size can be used to perform a variety of loop-back tests on the circuit under test 310.

In the present embodiment, the loop-back signal to the first operation circuit 370 is generated using the second operation circuit 380 in the same circuit under test 310, but as another example, the loop-back signal to the first operation circuit 370 may be generated using a circuit in another circuit under test 310. In this case, each loop-back section 120 may input a signal to a circuit in another circuit under test 310 via another loop-back section 120. Each loop-back section 120 may receive a signal from a circuit in another circuit under test 310 via another loop-back section 120.

Figure 6:
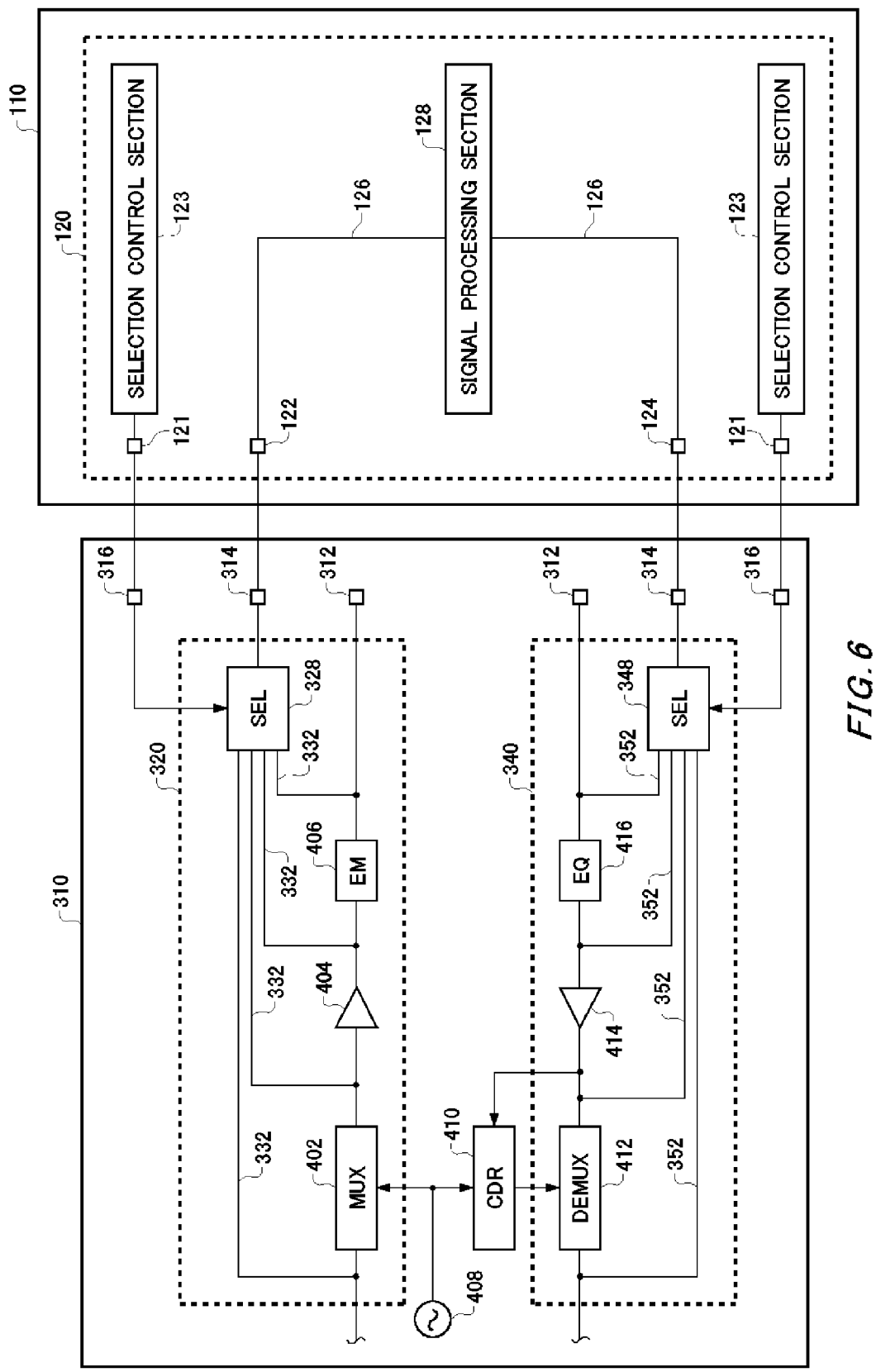
FIG. 6 shows another exemplary configuration of a circuit under test 310.

FIG. 6 shows another exemplary configuration of a circuit under test 310. In the present embodiment, a digital high-speed communication interface circuit is used as the circuit under test 310. The test circuit 110 may be the same as any test circuit 110 described in relation to FIGS. 1 to 5.

The transmission-side circuit 320 of the present embodiment includes a multiplexer 402, a driver 404, an emphasis circuit 406, a plurality of measurement lines 332, and a selecting section 328. The multiplexer 402 converts a parallel digital signal received from a logic circuit or the like into a serial digital signal. The multiplexer 402 may generate a digital signal whose bit rate corresponds to a period of a clock signal supplied thereto from a local clock source 408 provided in the circuit under test 310.

The driver 404 receives the digital signal generated by the multiplexer 402 and outputs a signal corresponding to this digital signal. For example, the driver 404 may output an analog signal whose signal level changes according to the logic value of each bit in the digital signal. The emphasis circuit 406 performs prescribed signal processing on the signal output by the driver 404. For example, the emphasis circuit 406 may emphasize a prescribed frequency component of the signal output by the driver 404. With this processing, degradation of the signal during transmission can be compensated for in the signal output from the transmission-side circuit 320.

The measurement lines 332 and the selecting section 328 may be the same as the measurement lines 332 and the selecting section 328 described in relation to FIGS. 1 to 5. In other words, each measurement line 332 has a first end that is connected to a measurement node in the transmission-side circuit 320 and a second end that is connected to the selecting section 328. The selecting section 328 selects which of the measurement lines 332 is connected to the loop-back section 120.

The reception-side circuit 340 of the present embodiment includes a demultiplexer 412, a receiver 414, an equalizer 416, a plurality of measurement lines 352, and a selecting section 348. The equalizer 416 receives a signal from the outside and performs prescribed signal processing on the received signal. For example, the equalizer 416 may emphasize a prescribed frequency component of the received signal. With this processing, degradation of the signal caused by signal transmission can be compensated for in the signal received by the reception-side circuit 340.

The receiver 414 supplies the demultiplexer 412 with a signal corresponding to the signal output by the equalizer 416. For example, the receiver 414 may convert the received analog signal into a digital signal. The demultiplexer 412 converts the serial digital signal output by the receiver 414 into a parallel digital signal.

The demultiplexer 412 may operate according to a clock signal received from a clock recovery circuit 410 provided in the circuit under test 310. For example, the demultiplexer 412 may detect the logic value of the serial digital signal according to the clock signal supplied thereto. The clock recovery circuit 410 may generate the clock signal to have substantially the same period as the signal output by the receiver 414.

The measurement lines 352 and the selecting section 348 may be the same as the measurement line 352 and selecting section 348 described in relation to FIGS. 1 to 5. In other words, each measurement node has a first end that is connected to a measurement node in the reception-side circuit 340 and a second end that is connected to the selecting section 348. The selecting section 348 selects which of the measurement lines 352 receives the signal from the loop-back section 120. In this way, the loop-back section 120 can perform a loop-back test, via a variety of measurement nodes, on a variety of circuits under test 310 such as wireless communication circuits and digital high-speed interface circuits.

Figure 7:
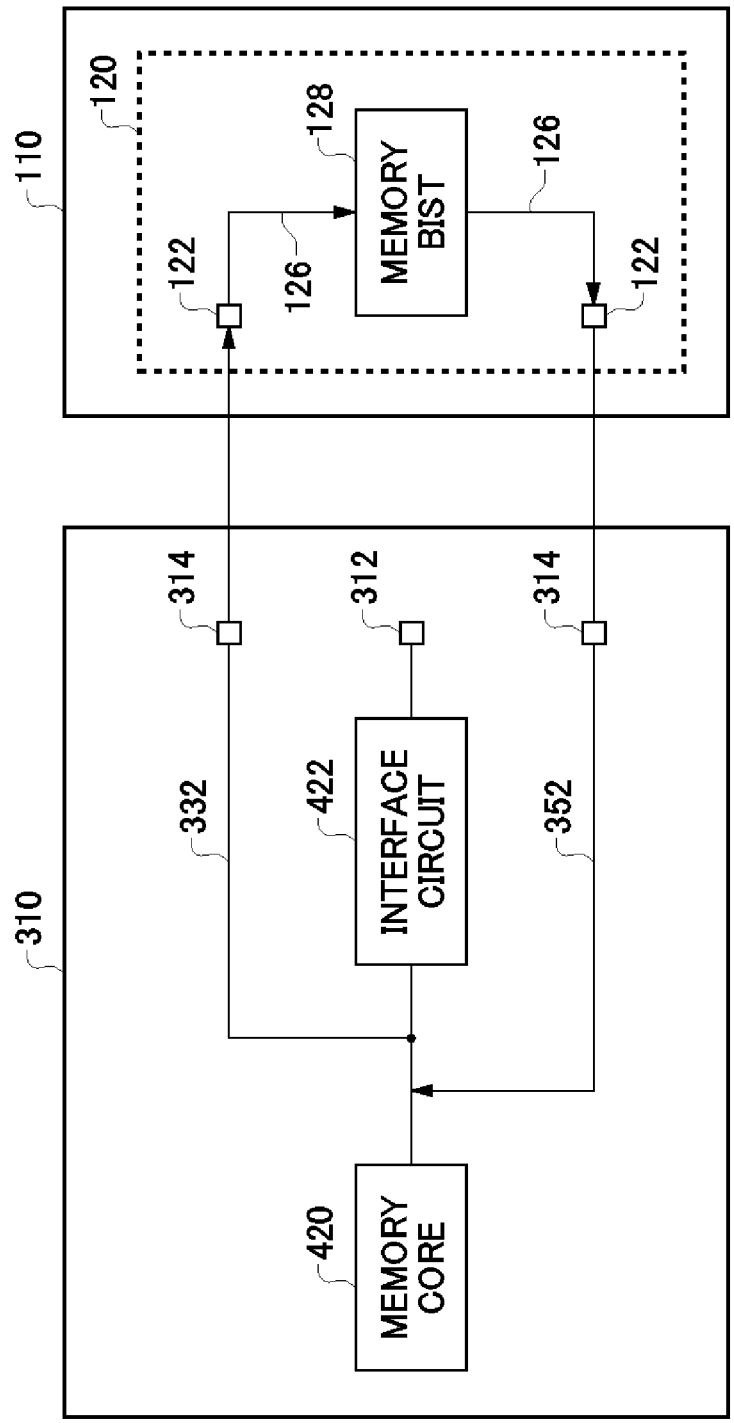
FIG. 7 shows another exemplary configuration of a circuit under test 310.

FIG. 7 shows another exemplary configuration of a circuit under test 310. In the present embodiment, a memory circuit is used as the circuit under test 310. The test circuit 110 may be the same as any test circuit 110 described in relation to FIGS. 1 to 5.

The circuit under test 310 of the present embodiment includes a memory core 420, an interface circuit 422, a measurement line 332, a measurement line 352, an actual operation terminal 312, and measurement terminals 314. The memory core 420 may be a semiconductor memory. The memory core 420 stores data supplied thereto or outputs data stored therein.

The interface circuit 422 controls the memory core 420 according to a signal supplied from the outside. For example, the interface circuit 422 may store write data provided thereto in an address of the memory core 420 corresponding to a write address provided thereto, according to a write command provided from the outside. The interface circuit 422 may read data from an address of the memory core 420 corresponding to a read address provided thereto, according to a read command provided from the outside. The measurement line 332 and the measurement line 352 each have a first end connected between the memory core 420 and the interface circuit 422 and a second end connected to a measurement terminal 314.

The test circuit 110 of the present embodiment includes, as the signal processing section 128, a memory BIST for testing the memory core 420. The memory BIST may be a circuit that performs a self-diagnosis, and is usually provided in a memory device. In the test system 400 of the present embodiment, since the test circuit 110 is provided near the wafer under test 300, the memory BIST to be provided near the operation circuits of the circuit under test 310 can be formed in the test circuit 110 to test the circuit under test 310. Therefore, the area in the circuit under test 310 in which actual operation circuits can be formed is increased.

The test circuit 110 may further perform a loop-back test of the interface circuit 422. For example, the test circuit 110 may perform a loop-back test of the interface circuit 422 via the actual operation terminal 312.

Figure 8:
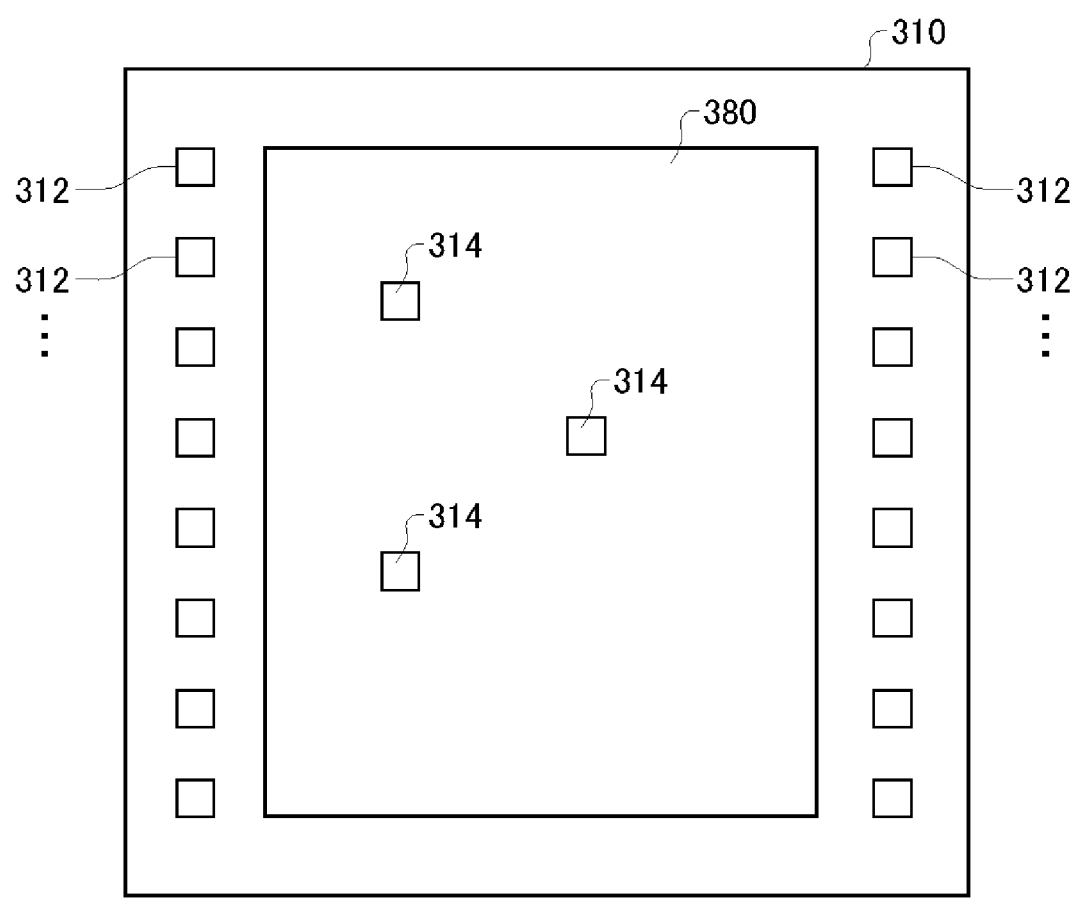
FIG. 8 shows an exemplary arrangement of measurement terminals 314 in a circuit under test 310.

FIG. 8 shows an exemplary arrangement of measurement terminals 314 in a circuit under test 310. Generally, the circuit under test 310 has a plurality of actual operation terminals 312 formed outside a circuit region 390 in which the operation circuits are formed. As shown in FIG. 8, the measurement terminals 314 may be formed in the circuit region 390.

The actual operation terminals 312 may be formed along each edge of a square shape. The measurement terminals 314, on the other hand, may be formed within the square shape. The measurement terminals 314 may instead be formed outside the circuit region 390, in the same manner as the actual operation terminals 312. The measurement terminals 314 may be formed along each edge of the square shape.

Figure 9:
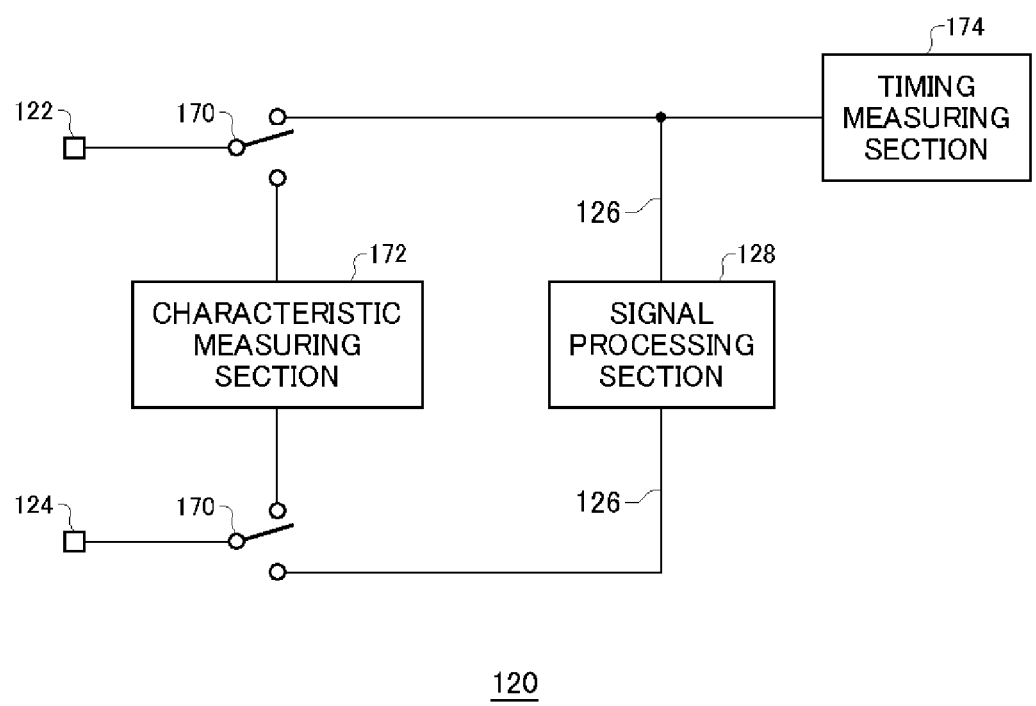
FIG. 9 shows another exemplary configuration of a loop-back section 120.

FIG. 9 shows another exemplary configuration of a loop-back section 120. The loop-back section 120 of the present embodiment further includes switches 170, a characteristic measuring section 172, and a timing measuring section 174 in addition to the configuration of the loop-back section 120 described in relation to FIGS. 1 to 8. The characteristic measuring section 172 and the timing measuring section 174 are examples of measurement circuits.

The characteristic measuring section 172 and the timing measuring section 174 measure a signal received from the circuit under test 310. For example, the characteristic measuring section 172 may measure the voltage value or the current value of this signal. The characteristic measuring section 172 may measure the current or the voltage supplied to the circuit under test 310 when a prescribed voltage or a prescribed current is applied to the circuit under test 310. In other words, the characteristic measuring section 172 may perform a voltage source current measurement (VSIM) or a current source voltage measurement (ISVM). The characteristic measuring section 172 may measure the current or the voltage when the operation of the circuit under test 310 is in a normal state. The characteristic measuring section 172 may judge pass/fail of the circuit under test 310 based on these measured values.

When the characteristic measuring section 172 judges pass/fail of the circuit under test 310, the loop-back section 120 preferably does not perform the loop-back test in parallel. The switches 170 switch which of the characteristic measuring section 172 and the noise generating section 132 is connected to the circuit under test. The switches 170 are provided respectively to the loop input terminal 122 and the loop output terminal 124, and switch which of the characteristic measuring section 172 and the noise generating section 132 is connected to the loop input terminal 122 or the loop output terminal 124.

The timing measuring section 174 may measure timing characteristics of the signal received from the circuit under test 310. For example, the timing measuring section 174 may measure the jitter of the edge timing of this signal. The timing measuring section 174 may measure the timing characteristics of the signal in parallel with a loop-back test via the signal processing section 128. The timing measuring section 174 may receive in parallel the signals input to the signal processing section 128.

The signal processing section 128 may perform signal processing corresponding to the judgment results of the timing measuring section 174 on the loop-back signal. For example, the signal processing section 128 may apply jitter corresponding to the jitter value measured by the timing measuring section 174 to the loop-back signal. More specifically, the signal processing section 128 may apply to the loop-back signal amplitude jitter corresponding to the difference between the amplitude value of the jitter to be included in the loop-back signal output by the signal processing section 128 and the jitter amplitude value measured by the timing measuring section 174. In this way, the amplitude of the jitter included in the loop-back signal to the reception-side circuit 340 can be accurately controlled.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test wafer unit and a test system for testing a plurality of circuits under test formed on a wafer under test.

What is claimed is:

1. A test wafer unit that tests a plurality of circuits under test formed on a wafer under test, the test wafer unit comprising:
    a test wafer that is formed of a semiconductor material and exchanges signals with each of the circuits under test; and
    a plurality of loop-back sections that are provided in the test wafer to correspond to the plurality of circuits under test and that each loop a signal output by a transmission circuit of the corresponding circuit under test back to a reception circuit of the corresponding circuit under test.

2. The test wafer unit according to claim 1, wherein each loop-back section receives an output signal from the corresponding circuit under test via an actual operation output terminal, which is used when the circuit under test is mounted, and loops the received output signal back to the reception circuit of the corresponding circuit under test.

3. The test wafer unit according to claim 2, wherein each loop-back section loops the received output signal back to the reception circuit of the corresponding circuit under test via an actual operation input terminal, which is used when the circuit under test is mounted.

4. The test wafer unit according to claim 2, wherein each loop-back section loops the received output signal back to an internal node of the corresponding circuit under test via a measurement input terminal, which is not used when the circuit under test is mounted.

5. The test wafer unit according to claim 1, wherein each loop-back section receives an internal signal transmitted on an internal node of the corresponding circuit under test via a measurement output terminal, which is not used when the circuit under test is mounted, and loops the received internal signal back to the reception circuit of the corresponding circuit under test.

6. The test wafer unit according to claim 5, wherein each circuit under test includes:
    a plurality of measurement lines that are provided to correspond to a plurality of measurement points in the circuit under test and that are each connected to a corresponding measurement point; and
    a selecting section that selects which of the measurement lines is electrically connected to the measurement output terminal, and
    each loop-back section includes a selection control section that controls which of the measurement lines the corresponding selecting section selects.

7. The test wafer unit according to claim 1, wherein each loop-back section includes an emulator circuit that passes the signal output by the transmission circuit of the corresponding circuit under test and simulates characteristics of a predetermined transmission path before the signal is looped back to the reception circuit of the corresponding circuit under test.

8. The test wafer unit according to claim 7, wherein each loop-back section further includes an impedance matching section that matches impedance between the corresponding circuit under test and a transmission path on which the signal output by the transmission circuit of the corresponding circuit under test is transmitted.

9. The test wafer unit according to claim 1, wherein each loop-back section includes a noise generating section that adds predetermined noise to the signal output by the transmission circuit of the corresponding circuit under test before the signal is looped back to the reception circuit of the corresponding circuit under test.

10. The test wafer unit according to claim 9, wherein each loop-back section further includes a measurement circuit that measures the signal output by the transmission circuit of the corresponding circuit under test.

11. The test wafer unit according to claim 10, wherein each measurement circuit measures timing characteristics of the signal output by the transmission circuit of the corresponding circuit under test.

12. The test wafer unit according to claim 10, further comprising switches that switch whether the circuits under test are connected to the measurement circuits or the noise generating sections.

13. The test wafer unit according to claim 1, wherein each loop-back section includes a DC level adjusting section that adjusts a DC level of the signal output by the transmission circuit of the corresponding circuit under test before the signal is looped back to the reception circuit of the corresponding circuit under test.

14. The test wafer unit according to claim 1, wherein each loop-back section includes:
    first wiring that supplies the signal output by the transmission circuit of the corresponding circuit under test to an operation circuit, which is formed in the wafer under test external to the transmission circuit and the reception circuit of the corresponding circuit under test, before the signal is looped back to the reception circuit of the corresponding circuit under test; and
    second wiring that supplies, to the reception circuit of the corresponding circuit under test, a signal output by the operation circuit in response to the signal supplied from the first wiring such that the signal output by the transmission circuit of the corresponding circuit under test is looped back to the reception circuit of the corresponding circuit under test via the first wiring, the operation circuit, and the second wiring.

15. A test system that tests a plurality of circuits under test formed on a wafer under test, the test system comprising:
    a test wafer unit that exchanges signals with the circuits under test; and
    a control apparatus that controls the test wafer unit, wherein the test wafer unit includes:
    a test wafer that is formed of a semiconductor material and exchanges signals with each of the circuits under test; and
    a plurality of loop-back sections that are provided in the test wafer to correspond to the plurality of circuits under test and that each loop a signal output by a transmission circuit of the corresponding circuit under test back to a reception circuit of the corresponding circuit under test.

16. The test system according to claim 15, wherein each loop-back section includes a noise generating section that adds predetermined noise to the signal output by the transmission circuit of the corresponding circuit under test before the signal is looped back to the reception circuit of the corresponding circuit under test.

17. The test wafer unit according to claim 16, wherein each loop-back section further includes a measurement circuit that measures the signal output by the transmission circuit of the corresponding circuit under test.

18. The test system according to claim 15, wherein each loop-back section includes a DC level adjusting section that adjusts a DC level of the signal output by the transmission circuit of the corresponding circuit under test before the signal is looped back to the reception circuit of the corresponding circuit under test.

19. The test wafer unit according to claim 15 wherein each loop-back section includes:
- an emulator circuit that passes the signal output by the transmission circuit of the corresponding circuit under test and simulates characteristics of a predetermined transmission path before the signal is looped back to the reception circuit of the corresponding circuit under test; and
- an impedance matching section that matches impedance between the corresponding circuit under test and a transmission path on which the signal output by the transmission circuit of the corresponding circuit under test is transmitted.

20. The test wafer unit according to claim 15, wherein beach loop-back section includes:

first wiring that supplies the signal output by the transmission circuit of the corresponding circuit under test to an operation circuit, which is formed in the wafer under test external to the transmission circuit and the reception circuit of the corresponding circuit under test, before the signal is looped back to the reception circuit of the corresponding circuit under test; and second wiring that supplies, to the reception circuit of the corresponding circuit under test, a signal output by the operation circuit in response to the signal supplied from the first wiring such that the signal output by the transmission circuit of the corresponding circuit under test is looped back to the reception circuit of the corresponding circuit under test via the first wiring, the operation circuit, and the second wiring.

* * * * *